(12) United States Patent
Yuan et al.

(10) Patent No.: US 10,476,373 B2
(45) Date of Patent: Nov. 12, 2019

(54) ELECTRONIC APPARATUS AND SYSTEM AND METHOD FOR CONTROLLING SERIES CONNECTED SWITCH MODULES

(71) Applicant: General Electric Company, Schenectady, NY (US)

(72) Inventors: Zhihui Yuan, By (DE); Richard S. Zhang, Shanghai (CN); Stefan Schroeder, By (DE); Yingqi Zhang, Shanghai (CN); Jie Shen, Shanghai (CN); Fan Zhang, Shanghai (CN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/772,953

(22) PCT Filed: Oct. 25, 2016

(86) PCT No.: PCT/US2016/058562
§ 371 (c)(1),
(2) Date: May 2, 2018

(87) PCT Pub. No.: WO2017/078962
PCT Pub. Date: May 11, 2017

(65) Prior Publication Data
US 2018/0323697 A1 Nov. 8, 2018

(30) Foreign Application Priority Data
Nov. 2, 2015 (CN) .......................... 2015 1 0734083

(51) Int. Cl.
*H02M 1/088* (2006.01)
*H02M 1/32* (2007.01)
(Continued)

(52) U.S. Cl.
CPC ............. *H02M 1/32* (2013.01); *H02M 1/088* (2013.01); *H02M 5/4585* (2013.01);
(Continued)

(58) Field of Classification Search
CPC ...... H02M 1/32; H02M 5/4585; H02M 1/088; H02M 2001/325; H03K 17/08116;
(Continued)

(56) References Cited

U.S. PATENT DOCUMENTS 6,301,133 B1 10/2001 Cuadra et al.
6,836,100 B2 12/2004 Egan et al.
(Continued)

FOREIGN PATENT DOCUMENTS

CN 103797714 A 5/2014
CN 104702125 A 6/2015
(Continued)

OTHER PUBLICATIONS

Abbate, C. et al., "Series connection of high power IGBT modules for traction applications," European Conference on Power Electronics and Applications, pp. 1-8 (Sep. 2005).
(Continued)

*Primary Examiner* — Jung Kim
(74) *Attorney, Agent, or Firm* — Wood IP LLC

(57) ABSTRACT

A method for controlling a plurality of series connected switch modules each including at least two parallel connected electronic switches, the method includes the step of, in response to failure of any electronic switch of one or more switch modules, turning on any non-faulty electronic switch of one or more faulty switch modules when the electronic switches of other non-faculty switch modules are controlled to be turned on.

17 Claims, 7 Drawing Sheets

(51) Int. Cl.
H03K 17/10 (2006.01)
H03K 17/12 (2006.01)
H02M 5/458 (2006.01)
H03K 17/081 (2006.01)

(52) U.S. Cl.
CPC . *H03K 17/08104* (2013.01); *H03K 17/08116* (2013.01); *H03K 17/107* (2013.01); *H03K 17/127* (2013.01); *H02M 2001/325* (2013.01)

(58) Field of Classification Search
CPC .......... H03K 17/08104; H03K 17/127; H03K 17/107; H03K 17/08122
See application file for complete search history.

(56) References Cited

U.S. PATENT DOCUMENTS

| | | | |
|---|---|---|---|
| 6,856,045 | B1 | 2/2005 | Beneditz et al. |
| 7,054,174 | B2 | 5/2006 | Wu |
| 7,071,661 | B2 | 7/2006 | Thalheim |
| 8,611,113 | B2 | 12/2013 | Asplund |
| 8,866,348 | B2 | 10/2014 | Venhaus et al. |
| 2009/0296433 | A1 | 12/2009 | Sihler et al. |
| 2012/0230076 | A1 | 9/2012 | Palmer et al. |
| 2012/0292999 | A1 | 11/2012 | Henkel et al. |
| 2013/0176752 | A1 | 7/2013 | Schelenz et al. |

FOREIGN PATENT DOCUMENTS

| | | |
|---|---|---|
| CN | 107294364 A | 10/2017 |
| EP | 2 330 740 A1 | 6/2011 |
| WO | 2012/175109 A1 | 12/2012 |
| WO | 2013/091326 A1 | 6/2013 |
| WO | 2013/139373 A1 | 9/2013 |
| WO | 2014/083214 A1 | 6/2014 |

OTHER PUBLICATIONS

Bauer, F., et al., "Suitability and optimization of high-voltage IGBTs for series connection with active voltage clamping," IEEE Transactions on Power Electronics, vol. 20, No. 6, pp. 1244-1253 (Nov. 2005).

Bruckmann, M. et al., "Series connection of high voltage IGBT modules," IEEE Industry Applications Conference, Thirty-Third IAS Annual Meeting, vol. 2, pp. 1067-1072 (Oct. 1998).

Chitta, V., et al., "Series connection of IGBTs with active voltage balancing," Conference Record of the 1997 IEEE Industry Applications Conference Thirty-Second IAS Annual Meeting, vol. 2, pp. 961-967 (Oct. 1997).

Gerster, C., et al., "Gate-control strategies for snubberless operation of series connected IGBTs," PESC Record. 27th Annual IEEE Power Electronics Specialists Conference, vol. 2, pp. 1739-1742 (Jun. 1996).

Hong, S., et al., "Series connection of IGBT's with active voltage balancing," IEEE Transactions on Industry Applications, vol. 35, Issue. 4, pp. 917-923 (Jul./Aug. 1999).

Lim, T.C., et al., "Active Snubber Energy Recovery Circuit for Series-Connected IGBTs," IEEE Transactions on Power Electronics, vol. 26, No. 7, pp. 1879-1889 (Jul. 2011).

Lu, T., et al., "Parameter design of voltage balancing circuit for series connected HV-IGBTs," Proceedings of the 7th International Power Electronics and Motion Control Conference, vol. 2, pp. 1502-1507 (Jun. 2012).

Lu, T., et al., "Active clamping circuit with status feedback for HV-IGBT," 15th International Conference on Electrical Machines and Systems, pp. 1-5 (Oct. 2012).

Lu, T., et al., "Active Clamping Circuit With Status Feedback for Series-Connected HV-IGBTs," IEEE Transactions on Industry Applications, vol. 50, No. 5, pp. 3579-3590 (Sep.-Oct. 2014).

Nakatake, H., and Iwata, A., "Series connection of IGBTs used multilevel clamp circuit and turn off timing adjustment circuit," IEEE 34th Annual Conference on Power Electronics Specialist, vol. 4, pp. 1910-1915 (Jun. 2003).

Nguyen, T-V., et al., "Series connection of IGBT," Twenty-Fifth Annual IEEE Applied Power Electronics Conference and Exposition (APEC), pp. 2238-2244 (Feb. 2010).

Okada, N., et al., "Series Connection of Snubberless IGBTs for 6.6 kV Transformerless Converters," Power Conversion Conference-Nagoya, pp. 1686-1691 (Apr. 2007).

Piazzesi, A., and Meysenc, L., et al., "Series connection of 3.3 kV IGBTs with active voltage balancing," IEEE 35th Annual Power Electronics Specialists Conference, vol. 2, pp. 893-898 (Jun. 2004).

Sasagawa, K., et al., "Voltage balancing method for IGBTs connected in series," IEEE Transactions on Industry Applications, vol. 40, No. 4, pp. 1025-1030 (Jul. 2004).

Wang, Y., et al., "An Analysis of High-Power IGBT Switching Under Cascade Active Voltage Control," IEEE Transactions on Industry Applications, vol. 45, No. 2, pp. 861-870 (Mar. 2009).

Withanage, R., et al., "Series connection of insulated gate bipolar transistors (IGBTs)," European Conference on Power Electronics and Applications, pp. 1-10 (Sep. 2005).

Withanage, R., and Shammas, N., "Series connection of insulated gate bipolar transistors (IGBTs)," IEEE Transactions on Power Electronics, vol. 27, Issue 4, pp. 2204-2212 (Apr. 2012).

Zhou, D., and Braun, D.H., "A practical series connection technique for multiple IGBT devices," IEEE 32nd Annual Power Electronics Specialists Conference, vol. 4, pp. 2151-2155 (Jun. 2001).

International Preliminary Report on Patentability issued in connection with corresponding PCT Application No. PCT/US2016/058562 dated May 8, 2018.

First Office Action and Search issued in connection with corresponding CN Application No. 201510734083.1 dated Jun. 4, 2018.

ELECTRONIC APPARATUS AND SYSTEM AND METHOD FOR CONTROLLING SERIES CONNECTED SWITCH MODULES

BACKGROUND OF THE INVENTION

The subject matter disclosed herein relates generally to power converters, and more particularly to a system and a method for controlling a plurality of series connected switch modules in a power converter.

Converters, such as direct current (DC)/DC converter or DC/alternating current (AC) inverter or AC/DC converter, employ IGBT modules as basic electronic switches. For high current applications, a typical IGBT module includes two or more IGBTs which can be connected in parallel to provide a larger current. For high voltage applications, a plurality of IGBT modules can be connected in series to provide a larger voltage.

Due to the series connection of the plurality of IGBT modules, a total number of IGBTs is increased, which may reduce reliability of the converter. For example, if there are three IGBT modules connected in series, then when one of the IGBT modules fails, the whole string may not be functional or the other series connected IGBTs may also fail subsequently. The IGBT may have failure due to overvoltage, etc.

In order to ensure the reliability of the converter, a redundancy of the series connected IGBT modules is desired.

BRIEF DESCRIPTION OF THE INVENTION

In accordance with one exemplary embodiment disclosed herein, an apparatus includes a plurality of switch units each including a plurality of series connected switch modules and a controller is provided. Each of the series connected switch modules includes at least two parallel connected electronic switches. The controller is configured to, in response to failure of any electronic switch of one or more switch modules, turn on any non-faulty electronic switch of one or more faulty switch modules when the electronic switches of other non-faulty switch modules are controlled to be turned on.

In accordance with another exemplary embodiment disclosed herein, a method for controlling a plurality of series connected switch modules each including at least two parallel connected electronic switches is provided. The method includes the step of, in response to failure of any electronic switch of one or more switch modules, turning on any non-faulty electronic switch of one or more faulty switch modules when the electronic switches of other non-faulty switch modules are controlled to be turned on.

In accordance with yet another exemplary embodiment disclosed herein, a system for controlling a plurality of series connected switch modules each including at least two parallel connected electronic switches is provided. The system includes a controller configured to, in response to failure of any electronic switch of one or more switch modules, turn on any non-faulty electronic switch of one or more faulty switch modules when the electronic switches of other non-faulty switch modules are controlled to be turned on.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

In an effort to provide a concise description of these embodiments, not all features of an actual implementation are described in one or more specific embodiments. It should be appreciated that in the development of any such actual implementation, as in any engineering or design project, numerous implementation-specific decisions must be made to achieve the developers' specific goals, such as compliance with system-related and business-related constraints, which may vary from one implementation to another.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either any, several, or all of the listed items. The use of "including," "comprising," or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. The terms "circuit," "circuitry," and "controller" may include either a single component or a plurality of components, which are either active and/or passive components and may be optionally connected or otherwise coupled together to provide the described function.

Figure 1:
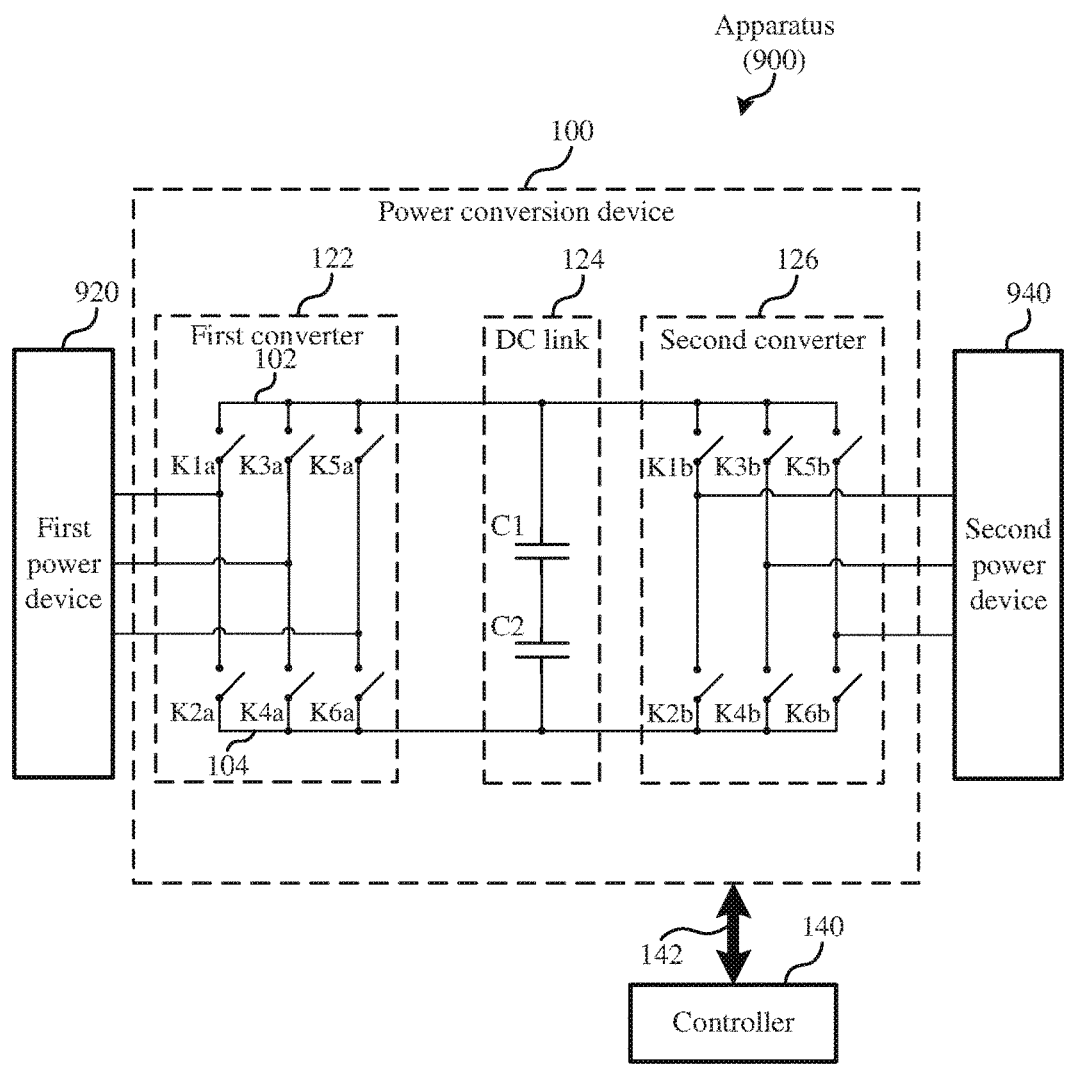
FIG. 1 illustrates a schematic diagram of an apparatus in accordance with an exemplary embodiment of the present disclosure.

FIG. 1 illustrates a schematic diagram of an apparatus 900 in accordance with an exemplary embodiment of the present disclosure. The apparatus 900 may be used in high power and high voltage applications. For example, the apparatus 900 can be utilized in the following areas, including but not limited to, power plant (e.g., wind power plant), and natural gas compressing industry, etc., for driving one or more particular loads, such as pump, motor, fan, etc.

As illustrated in FIG. 1, the apparatus 900 includes a first power device 920, a power conversion device 100, a controller 140, and a second power device 940. In the exemplary embodiment, the controller 140 is arranged to be in communication with the power conversion device 100 and may transmit control signals 142 to the power conversion device 100 via one or more electrical links or wires for example. The power conversion device 100 can be operated to perform unidirectional or bidirectional power conversion between the first power device 920 and the second power device 940.

The power conversion device 100 includes a first converter 122, a DC link 124, and a second converter 126. In the exemplary embodiment, the first converter 122 may be an AC/DC converter 122 which is configured to convert AC electric power provided from the first power device 920 (e.g., power grid) into DC electric power.

In the exemplary embodiment, the DC link 124 may include multiple capacitors configured to filter the DC electric power provided from the first converter 122, and supply filtered DC electric power to the second converter 126.

In the exemplary embodiment, the second converter 126 may include a DC/AC converter which is configured to convert the DC electric power provided from the DC link 124 into AC electric power, and supply the AC electric power to the second power device 940.

In some embodiment, the second power device 940 may include a load such as an electric motor used in a natural gas compressing device, a fan, or a pump, which can be driven by the AC electric power from the second converter 126.

In the exemplary embodiment, the first converter 122 may include six switch units K1a, K2a, K3a, K4a, K5a, and K6a. Two switch units K1a, K2a are coupled in series between a first DC line 102 and a second DC line 104, so as to constitute a first phase leg, a connection point between the switch units K1a, K2a is coupled to the first power device 920. Two switch units K3a, K4a are coupled in series between the first DC line 102 and the second DC line 104, so as to constitute a second phase leg, a connection point between the switch units K3a, K4a is coupled to the first power device 920. Two switch units K5a, K6a are coupled in series between the first DC line 102 and the second DC line 104, so as to constitute a third phase leg, a connection point between the switch units K5a, K6a is coupled to the first power device 920. In other embodiments, the first converter 122 may be constructed to have a rectifier bridge structure formed by multiple diodes for converting the first AC electric power to the first DC electric power.

In other embodiments, the first converter 122 and the second converter 126 may be multi-level converters. In other embodiments, the first converter 122 and the second converter 126 may be current source converters.

As a non-limiting example, the DC link 124 includes two capacitors C1, C2 coupled in series between the first DC line 102 and the second DC line 104.

As a non-limiting example, the second converter 122 includes six switch units K1b, K2b, K3b, K4b, K5b, and K6b. Two switch units K1b, K2b are coupled in series between the first DC line 102 and the second DC line 104, so as to constitute a first phase leg, a connection point between the switch units K1b, K2b is coupled to the second power device 940. Two switch units K3b, K4b are coupled in series between the first DC line 102 and the second DC line 104, so as to constitute a second phase leg, a connection point between the switch units K3b, K4b is coupled to the second power device 940. Two switch units K5b, K6b are coupled in series between the first DC line 102 and the second DC line 104, so as to constitute a third phase leg, a connection point between the switch units K5b, K6b is coupled to the second power device 940.

Figure 2:
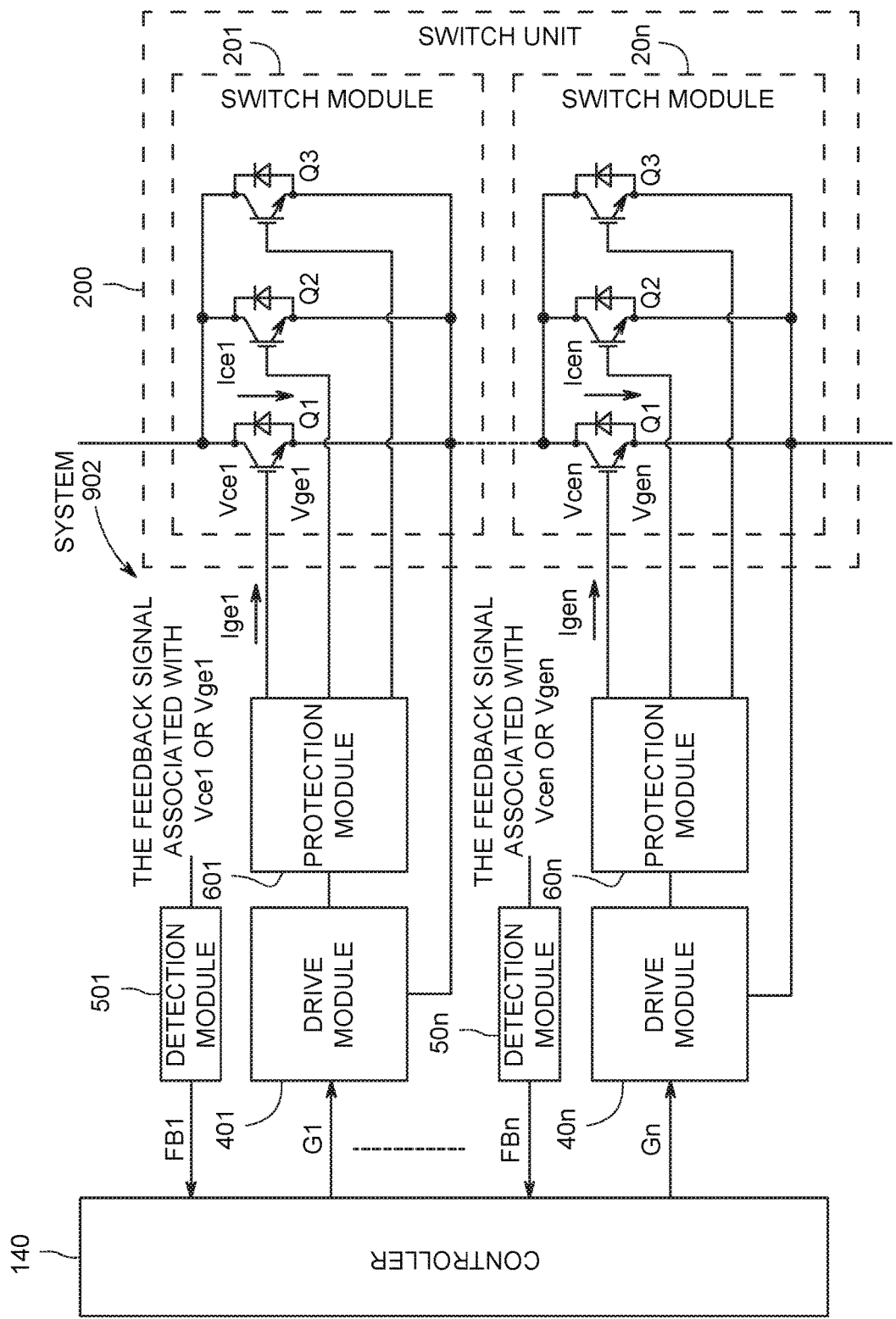
FIG. 2 illustrates a schematic diagram of a system for controlling the series connected switch modules in accordance with a first exemplary embodiment of the present disclosure.

FIG. 2 illustrates a schematic diagram of a system 902 for controlling the series connected switch modules 201, . . . 20n in accordance with a first exemplary embodiment of the present disclosure.

The switch unit 200 can be one of the switch units K1a, K2a, K3a, K4a, K5a, and K6a comprised in the first converter 122 or one of the switch units K1b, K2b, K3b, K4b, K5b, and K6b comprised in the second converter 126.

The switch unit 200 includes the series connected switch modules 201, . . . 20n. In the embodiment, each of the switch modules 201, . . . 20n comprises three parallel connected electronic switches Q1, Q2, and Q3. In the exemplary embodiment, each of the electronic switches Q1, Q2, and Q3 is an insulated bipolar transistor (IGBT). In other embodiments, each of the electronic switches Q1, Q2, and Q3 may be a metal oxide semiconductor field effect transistor (MOSFET), an injection enhanced gate transistor (IEGT), a giant transistor (GTR), or any other controllable switch.

In the exemplary embodiment, each of the switch modules 201, . . . 20n includes three parallel connected flat-pack IGBTs. In other embodiments, each of the switch modules 201, . . . 20n comprises two parallel connected IGBTs or more than three parallel connected flat-pack IGBTs. As a non-limiting embodiment, flat-pack IGBTs can be PrimePACK IGBT modules, EconoPACK IGBT modules, EconoDUAL IGBT modules, or IGBT high-power modules (IHM).

If each of the electronic switches Q1, Q2, Q3 is utilized as individual IGBT for example, and if a current flowing through the individual IGBT increases to a level greater than a predetermined current, then the individual IGBT may have failure due to overcurrent. Based on the above consideration, the electronic switches Q1, Q2, Q3 are connected in parallel to share the increased current, and thus, the power conversion device 100 can provide a larger output current to the second power device 940.

Furthermore, taking each of the electronic switches Q1, Q2, and Q3 as the individual IGBT for example, if a voltage across the individual IGBT becomes greater than a predetermined voltage, the individual IGBT may have failure due to overvoltage. Based on the above consideration, the plurality n of switch modules 201, . . . 20n are connected in series to provide the larger voltage, therefore the power conversion device 100 can provide a larger output voltage to the second power device 940.

The series connected switch modules 201, . . . 20n may include redundant switch modules. For example, if one switch module is rated for 1 kV and the voltage requirement is 5 kV, then five series connected switch modules are sufficient to meet the voltage requirements. However, in some embodiment, seven series connected switch modules may be utilized where two switch modules will be used as redundant switch modules. Similarly, the parallel connected electronic switches Q1, Q2, and Q3 may include redundant electronic switches i.e., additional electronic switches apart from the electronic switches that will be sufficient for meeting larger current requirements.

The system 902 includes a plurality n of drive modules 401, . . . 40n. In the exemplary embodiment, during normal operation, the controller 140 is configured for controlling the drive modules 401, . . . 40n to generate a plurality n of respective normal control signals which are used for turning on or off the electronic switches Q1, Q2, and Q3 of the respective switch modules 201, . . . 20n. In other embodiments, the plurality n of drive modules 401, . . . 40n can be integrated in the controller 140.

The system 902 further includes a plurality n of detection modules 501, . . . 50n. The detection modules 501, . . . 50n are configured to detect whether any electronic switch of the respective series connected switch modules 201, . . . 20n is faulty or has failure, and generate one or more fault signals for identifying one or more faulty switch modules if any electronic switch of one or more switch modules has failure.

In detail, in one exemplary embodiment, each of the detection modules 501, . . . 50n is configured to generate the faulty signal if a control terminal voltage of a respective one of the series connected switch modules 201, . . . 20n (e.g. Vge1 across the electronic switch Q1 of the switch module 201 or Vgen across the electronic switch Q1 of the switch module 20n) is deviated from its expected voltage in normal operation by a predetermined voltage drop due to occurrence of shorted control terminal in any faulty electronic switch (e.g., shorted gate in any fault IGBT) of the respective one of the series connected switch modules 201, . . . 20n.

In another exemplary embodiment, each of the detection modules 501, . . . 50n is configured to generate the faulty signal if a respective normal control signal configured to turn off the electronic switches Q1, Q2, Q3 of a respective one of the series connected switch modules 201, . . . 20n and a voltage magnitude of a feedback signal associated with a voltage across the electronic switches Q1, Q2, Q3 (e.g. Vce1 across the electronic switch Q1 of the switch module 201 or Vcen across the electronic switch Q1 of the switch module 20n) of a respective one of the series connected switch modules 201, . . . 20n are smaller than or equal to a predetermined voltage magnitude.

In yet another exemplary embodiment, each of the detection modules 501, . . . 50n is configured to generate the faulty signal if overshoot of a current flowing through a respective one of the series connected switch modules 201, . . . 20n (e.g. Ige1 or Ice1 flowing through the electronic switch Q1 of the switch module 201 or Igen or Icen flowing through the electronic switch Q1 of the switch module 20n) is greater than a predetermined value due to occurrence of a short circuit current through any faulty electronic switch of the respective one of the series connected switch modules 201, . . . 20n.

The controller 140 is further configured for, in response to failure of any electronic switch of one or more switch modules, controlling the drive modules 401, . . . 40n to turn on any non-faulty electronic switch of one or more faulty switch modules when the electronic switches Q1, Q2, Q3 of other non-faulty switch modules are controlled to be turned on. In detail, the controller 140 is further configured for, in response to failure of any electronic switch of one or more switch modules, controlling the drive modules 401, . . . 40n to continuously turn on any non-faulty electronic switch of one or more faulty switch modules.

In the exemplary embodiment, if a total number of the fault signals from the detection modules 501, . . . 50n is smaller than or equal to a total number of redundant switch modules included in the series connected switch modules 201, . . . 20n, the controller 140 is further configured for controlling the drive modules 401, . . . 40n to continuously turn on any non-faulty electronic switch of one or more faulty switch modules, and turn on or off the electronic switches Q1, Q2, Q3 of other non-faulty switch modules. Therefore, the series connected switch modules 201, . . . 20n remain operational subsequent to failure of any electronic switch of one or more switch modules. If the total number of the fault signals is greater than the total number of the redundant switch modules, the controller 140 is further configured for controlling the drive modules 401, . . . 40n to turn off the electronic switches Q1, Q2, Q3 of the non-faulty switch modules. Therefore, the redundancy of the series connected switch modules 201, . . . 20n is realized, and reliability of the power conversion device 100 is greatly improved.

In other exemplary embodiments, the drive modules 401, . . . 40n are further configured to turn on or off any non-faulty electronic switch of one or more faulty switch modules, and turn on or off the electronic switches of non-faulty switch modules if the total number of the fault signals is smaller than or equal to the total number of redundant switch modules.

The system 902 further includes a plurality n of protection modules 601, . . . 60n. The protection modules 601, . . . 60n are coupled between the respective drive modules 401, . . . 40n and the electronic switches Q1, Q2, Q3 of the respective series connected switch modules 201, . . . 20n.

It is easily understood that, if the detection modules 501, . . . 50n do not generate one or more fault signals, the controller 140 is configured for controlling the drive modules 401, . . . 40n to generate the respective normal control signals. The normal control signals are transmitted to the electronic switches Q1, Q2, Q3 of the respective switch modules 201, . . . 20n through the respective protection module 601, . . . 60n, and the electronic switches Q1, Q2, Q3 of the switch modules 201, . . . 20n are turned on or off according to the respective normal control signals.

The controller 140 is further configured for controlling the drive modules 401, . . . 40n to generate one or more alternative control signals in response to one or more fault signals.

In the exemplary embodiment, each of the protection modules 601, . . . 60n is configured to maintain a voltage magnitude of the respective alternative control signal at a desired voltage magnitude, such that one or more alternative control signals are sufficient to continuously turn on any non-faulty electronic switch of one or more faulty switch modules.

Figure 3:
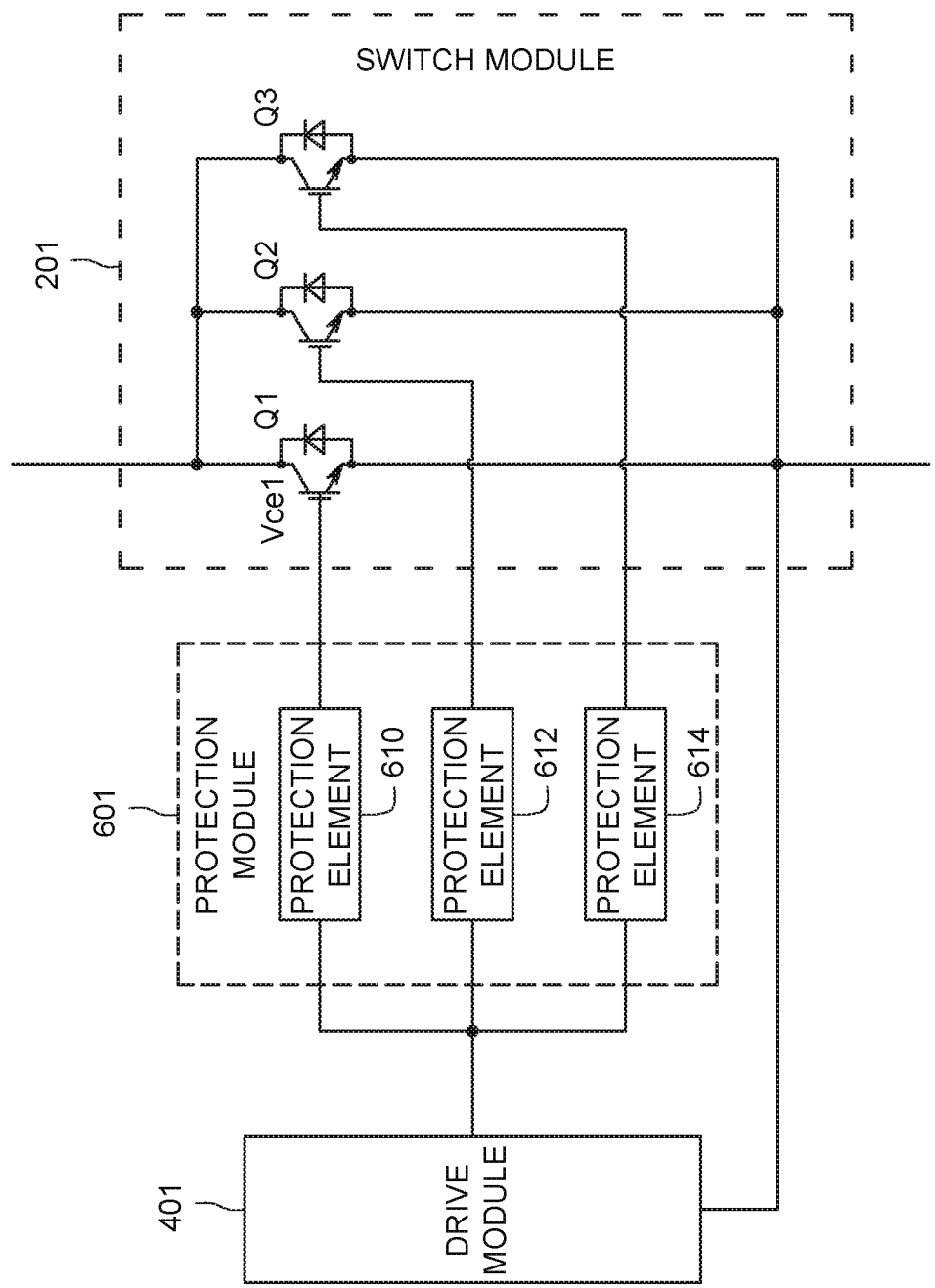
FIG. 3 illustrates a schematic diagram of the protection module of FIG. 2 in accordance with an exemplary embodiment of the present disclosure.

FIG. 3 illustrates a circuit diagram of the protection module of FIG. 2 in accordance with an exemplary embodiment of the present disclosure. In FIG. 3, taking the protection module 601 as an example, the protection module 601 includes three protection elements 610, 612, 614 coupled between the drive module 401 and three respective electronic switches Q1, Q2, Q3 of the switch module 201. The other protection modules of FIG. 2 have the same structure as the protection module 601.

In one embodiment, each of the protection elements 610, 612, 614 is an impedance of high enough value, such that a short circuit occurred on a control terminal of any one of the electronic switches Q1, Q2, Q3 does not degrade the control signal magnitude on the control terminal of any other electronic switch to be below a minimum value that is needed to turn on the electronic switch.

In another embodiment, each of the protection elements 610, 612, 614 is an independent driver stage that generates a separate control signal for continuously turning on a respective one of the electronic switches Q1, Q2, Q3. The independent driver stages of the electronic switches Q1, Q2, Q3 are designed such that a short circuit occurred on a control terminal of any one of the electronic switches Q 1, Q2, Q3 does not degrade the control signal magnitude on the control terminal of any other electronic switch to be below a minimum value that is needed to turn on the electronic switch. In one embodiment, each independent driver stage can be achieved by separating a power supply of the independent driver stage with individual current limitation or over current shutdown.

In yet another embodiment, each of the protection elements 610, 612, 614 is configured to be ignited or exhibit high resistance due to a short circuit current occurred and flowed through a respective one of the electronic switches Q1, Q2, Q3, such that a current path between the drive module 401 and the respective one of the electronic switches Q1, Q2, Q3 is cut off.

In the exemplary embodiment, each of the protection elements 610, 612, 614 is a fuse element. If the electronic switch Q1 has failure due to overvoltage, as a non-limiting example, a short circuit current flows through the gate and the emitter of the electronic switch Q1, a fuse element 610 is ignited by the short circuit current, a current path between the drive module 401 and the electronic switch Q1 is cut off, therefore the alternative control signal of the drive module 401 can continuously turn on the electronic switches Q2 and Q3.

If the electronic switch Q2 has failure due to overvoltage, as a non-limiting example, a short circuit current flows through the gate and the emitter of the electronic switch Q2, the fuse element 612 is ignited by the short circuit current, a current path between the drive module 401 and the electronic switch Q2 is cut off, therefore the alternative control signal of the drive module 401 can continuously turn on the electronic switches Q1 and Q3.

If the electronic switch Q3 has failure due to overvoltage, as a non-limiting example, a short circuit current flows through the gate and the emitter of the electronic switch Q3, the fuse element 614 is ignited by the short circuit current, a current path between the drive module 401 and the electronic switch Q3 is cut off, therefore the alternative control signal of the drive module 401 can continuously turn on the electronic switches Q1 and Q2.

In other embodiment, each of the protection elements 610, 612, 614 is a positive temperature coefficient (PTC) resistor, the operating principle of the PTC resistor is the same as the fuse element, which is not described herein for simplification.

Figure 4:
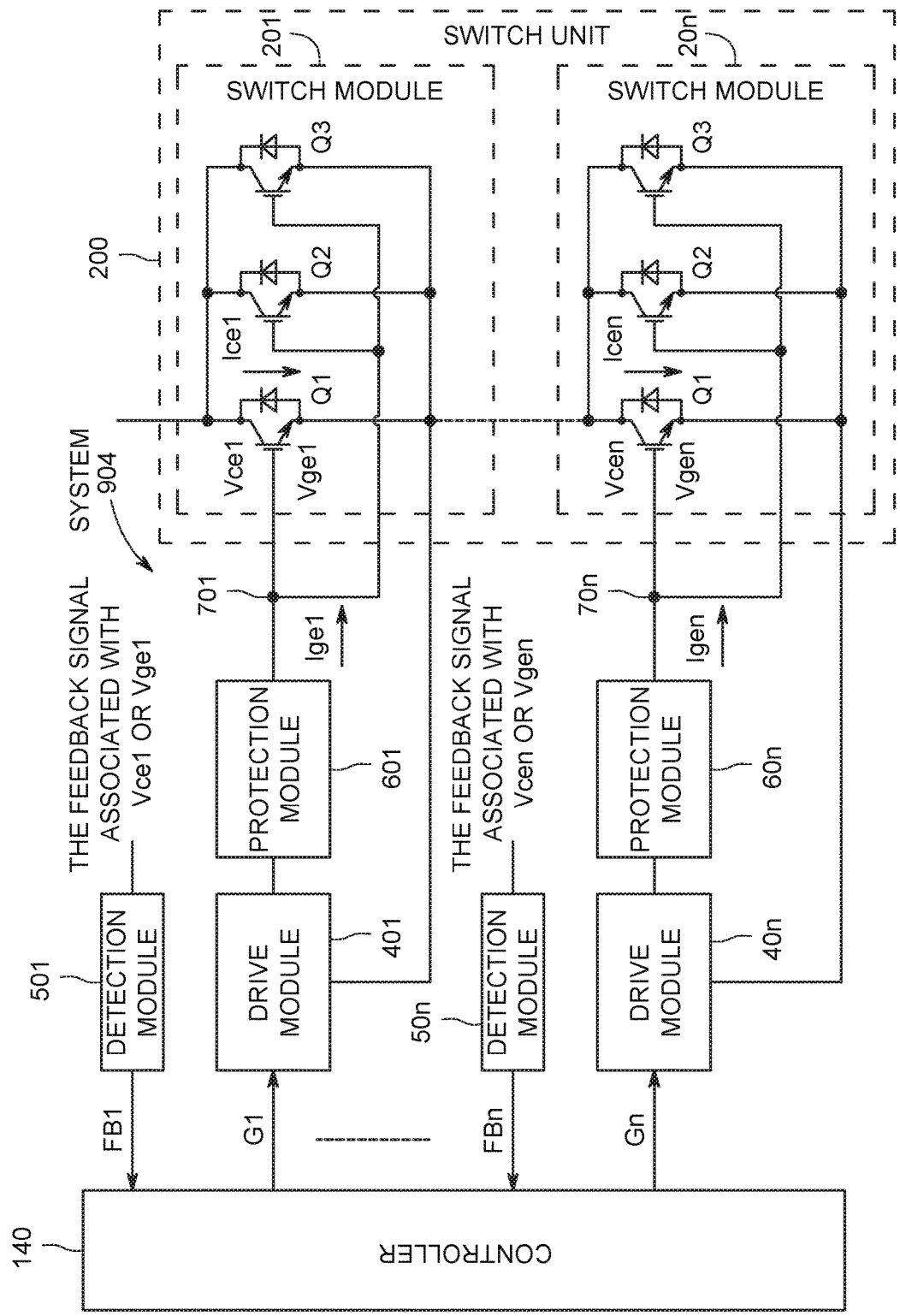
FIG. 4 illustrates a schematic diagram of a system for controlling the series connected switch modules in accordance with a second exemplary embodiment of the present disclosure.

FIG. 4 illustrates a schematic diagram of a system 904 for controlling the series connected switch modules 201, . . . 20n in accordance with a second exemplary embodiment of the present disclosure. A difference between the system 904 of FIG. 4 and the system 902 of FIG. 2 is that control terminals of the electronic switches Q1, Q2, Q3 of the switch modules 201, . . . , 20n are coupled to respective common points 701, . . . , 70n which are coupled to the respective drive modules 401, . . . , 40n via the respective protection modules 601, . . . , 60n. Taking the switch module 201 as one example, control terminals of the electronic switches Q1, Q2, Q3 of the switch module 201 are coupled to the common point 701 which is coupled to the drive module 401 via the protection module 601. Taking the switch module 20n as another example, control terminals of the electronic switches Q1, Q2, Q3 of the switch module 20n are coupled to the common point 70n which is coupled to the drive module 40n via the protection module 60n.

Figure 5:
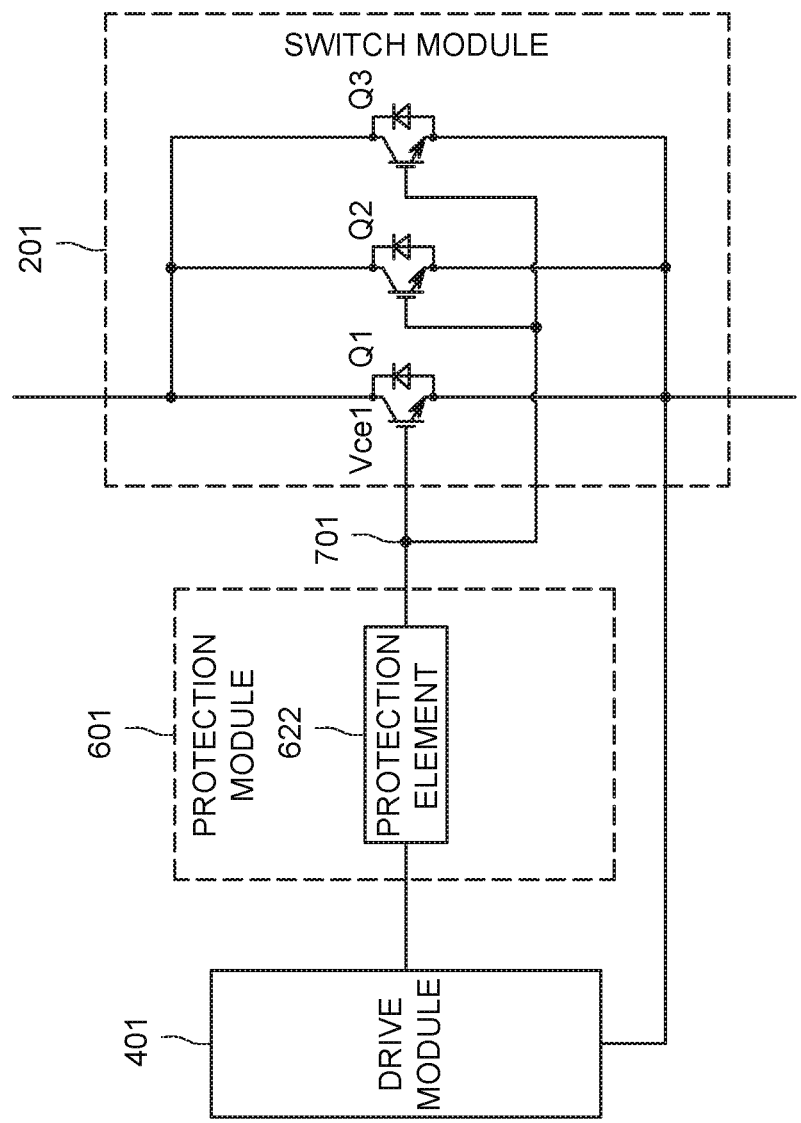
FIG. 5 illustrates a schematic diagram of the protection module of FIG. 4 in accordance with an exemplary embodiment of the present disclosure.

FIG. 5 illustrates a circuit diagram of the protection module of FIG. 4 in accordance with an exemplary embodiment of the present disclosure. In FIG. 5, taking the protection module 601 as an example, the protection module 601 includes a protection element 622 coupled between the drive module 401 and the electronic switches Q1, Q2, Q3 of the switch module 201. The other protection modules of FIG. 4 have the same structure as the protection module 601.

In the exemplary embodiment, the protection element 622 can be an internal resistance of the drive module 401, the internal resistance of the drive module 401 is small enough and a voltage value of the alternative control signal of the drive module 401 is large enough to turn on the electronic switches Q1, Q2, Q3. If the electronic switch Q1 has failure due to overvoltage, as a non-limiting example, a short circuit current generated by the electronic switch Q1 flows through the protection element 622, because the resistance of the protection element 622 is small enough, the voltage across the protection element 622 is small enough, the alternative control signal having a large voltage value is sufficient to continuously turn on the electronic switches Q2, and Q3.

Similarly, if the electronic switch Q2 has failure due to overvoltage, as a non-limiting example, the alternative control signal having a large voltage value is sufficient to continuously turn on the electronic switches Q1, and Q3. If the electronic switch Q3 has failure due to overvoltage, as a non-limiting example, the alternative control signal having a large voltage value is sufficient to continuously turn on the electronic switches Q1, and Q2.

Figure 6:
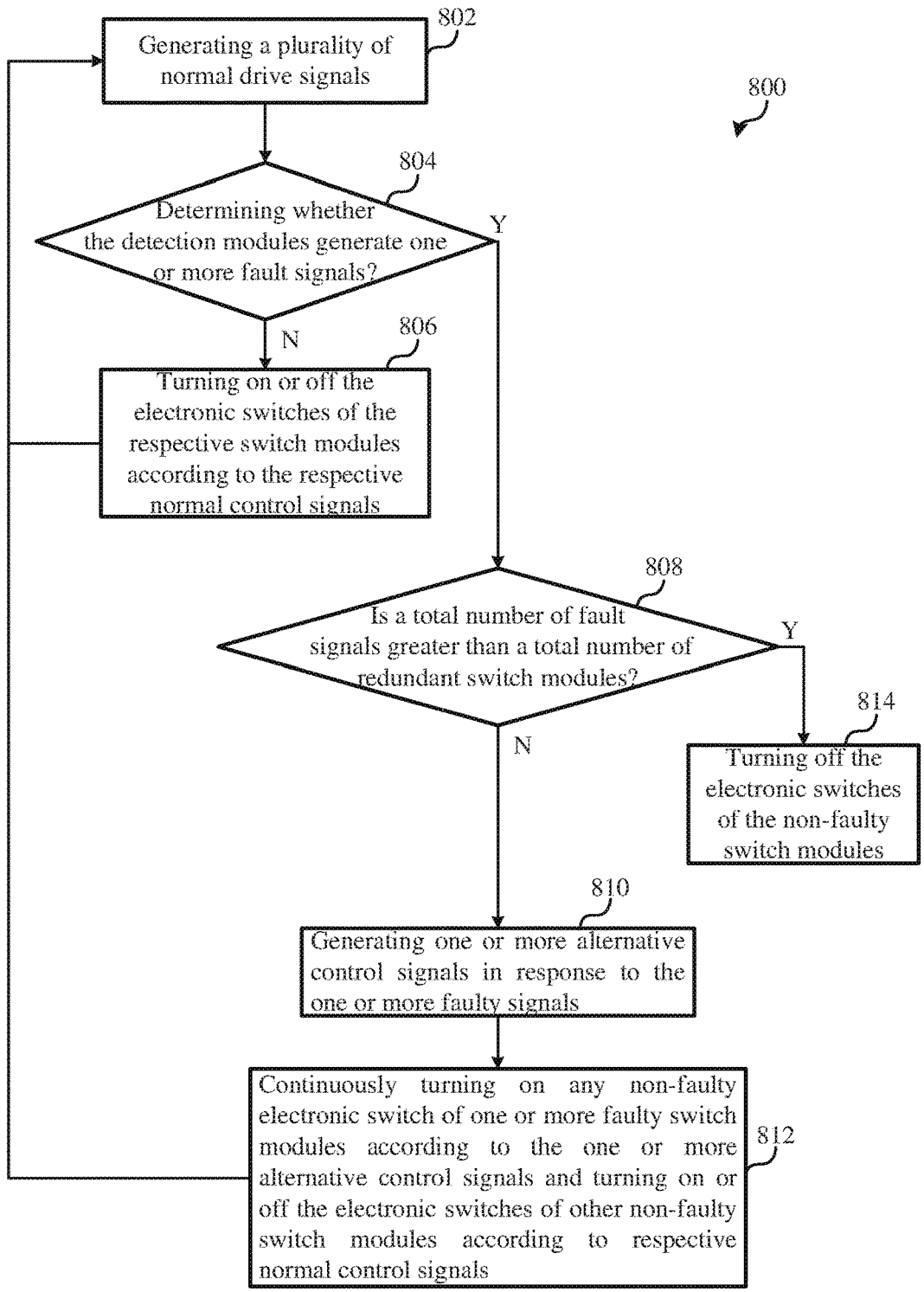
FIG. 6 is a flow chart illustrating a method for controlling the series connected switch modules in accordance with an exemplary embodiment of the present disclosure.

FIG. 6 is a flow chart illustrating a method 800 for controlling the series connected switch modules 201, . . . 20n in accordance with an exemplary embodiment of the present disclosure. The method 800 is applied to the embodiment shown in FIG. 2 or FIG. 4, the method 800 comprises the following steps.

Step 802: the controller 140 controls the drive modules 401, . . . 40n to generate a plurality n of respective normal control signals which are used for turning on or off the electronic switches Q1, Q2, and Q3 of the respective series connected switch modules 201, . . . 20n.

Step 804: the controller 140 determines whether the detection modules 501, . . . 50n generate one or more fault signals for one or more faulty switch modules. If the detection modules 501, . . . 50n generate one or more fault signals, the process goes to step 808. Otherwise, the process goes to step 806.

Step 806: the normal control signals generated by the drive modules 401, . . . 40n turn on or off the electronic switches Q1, Q2, Q3 of the respective switch modules 201, . . . 20n, then the process goes to step 802.

Step 808: the controller 140 determines whether a total number of the fault signals from the detection modules 501, . . . 50n is greater than a total number of redundant switch modules comprised in the series connected switch modules 201, . . . 20n. If the total number of the fault signals is smaller than or equal to the total number of redundant switch modules, the process goes to step 810. Otherwise, the process goes to step 814.

Step 810: the controller 140 controls the drive modules 401, . . . 40n to generate one or more alternative control signals according to one or more fault signals.

Step 812: in the exemplary embodiment, the drive modules 401, . . . 40n continuously turn on any non-faulty electronic switch of one or more faulty switch modules according to one or more alternative control signals, and turning on or off the electronic switches Q1, Q2, Q3 of other non-faulty switch modules according to the respective normal control signals, then the process goes to step 802.

Step 814: the controller 140 controls the drive modules 401, . . . 40n to turn off any non-faulty electronic switch of the respective series connected switch modules 201, . . . 20n. In other embodiments, the drive modules 401, . . . 40n are integrated in the controller 140.

Figure 7:
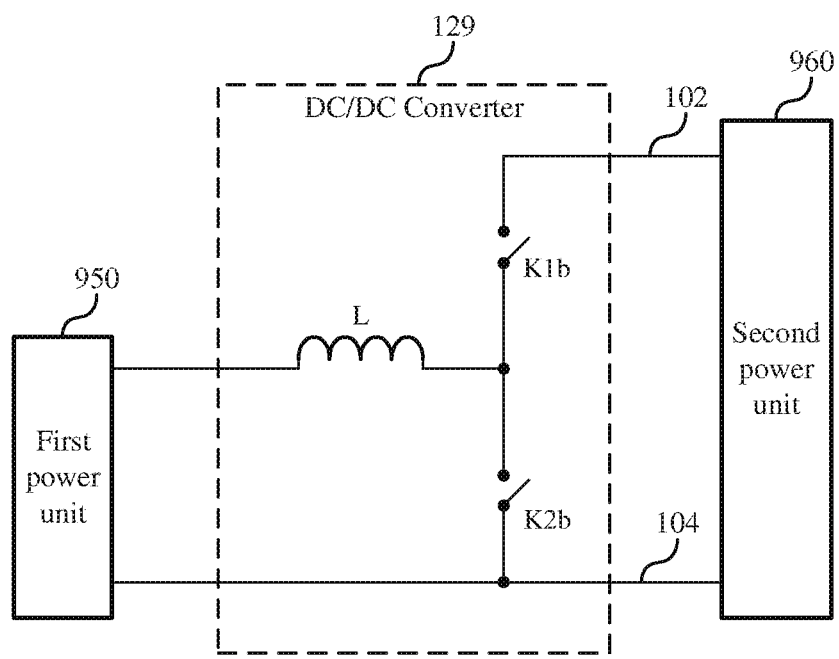
FIG. 7 illustrates a DC/DC converter in accordance with an exemplary embodiment of the present disclosure.

FIG. 7 illustrates a DC/DC converter in accordance with an exemplary embodiment of the present disclosure. In FIG. 7, the DC/DC converter 129 includes an inductor L, and two switch units K1b, K2b. Two switch units K1b, K2b are connected in series between a first DC bus 102 and a second DC bus 104. The inductor L is coupled between a first power unit 950 and a connection point of two switch units K1b, K2b. The DC/DC converter 129 is configured to convert one DC electric power from the first power unit 950 into another DC electric power supplied to a second power unit 960. Referring back to FIG. 2 and FIG. 4, the switch unit 200 of FIG. 2 and the switch unit 200 of FIG. 4 can be one of the switch units K1b and K2b comprised in the DC/DC converter 129.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure will not be limited to the particular embodiment disclosed as the best mode contemplated for carrying out this disclosure, but that the disclosure will include all embodiments falling within the scope of the appended claims.

The invention claimed is:

1. An apparatus, comprising:
   a plurality of switch units each comprising a plurality of series connected switch modules, each of the series connected switch modules comprising at least two parallel connected electronic switches;
   a detection module configured to detect whether any electronic switch of the respective series connected switch modules has a failure, and generate one or more fault signals for identifying one or more faulty switch modules which have a failure; and
   a controller configured to:
      in response to failure of any electronic switch of one or more switch modules, turn on any non-faulty electronic switch of one or more faulty switch modules when the electronic switches of other non-faulty switch modules are controlled to be turned on; and
      turn off the electronic switches of the non-faulty switch modules if the total number of the fault signals is greater than the total number of redundant switch modules.

2. The apparatus of claim 1, wherein the controller is further configured to, in response to failure of any electronic switch of one or more switch modules, continuously turn on any non-faulty electronic switch of the faulty switch modules.

3. The apparatus of claim 1, wherein the controller is further configured to continuously turn on any non-faulty electronic switch of the faulty switch modules, and turn on or off the electronic switches of other non-faulty switch modules if a total number of the fault signals from the detection modules is smaller than or equal to a total number of redundant switch modules comprised in the series connected switch modules.

4. The apparatus of claim 1, wherein the controller is further configured to generate one or more alternative control signals for continuously turning on any non-faulty electronic switch of one or more faulty switch modules according to one or more fault signals, the apparatus further comprising a plurality of protection modules coupled between the controller and the electronic switches of the respective series connected switch modules;
   wherein the protection modules are configured to maintain a voltage magnitude of the respective alternative control signals at a desired voltage magnitude, such that the alternative control signals are sufficient to continuously turn on any non-faulty electronic switch of the respective faulty switch modules.

5. The apparatus of claim 4, wherein:
   control terminals of the electronic switches of each switch module are coupled to a common point which is coupled to the controller via the respective protection module.

6. The apparatus of claim 4, wherein each protection module comprises protection elements coupled between the controller and the respective electronic switches of the corresponding switch module;
   the protection elements of each protection module are configured to limit currents flowed from the controller to the respective faulty electronic switches of the corresponding switch module.

7. The apparatus of claim 6, wherein each of the protection elements comprises a fuse element or a positive temperature coefficient (PTC) resistor.

8. The apparatus of claim 4, wherein the protection elements of each switch module are impedances of high enough value, such that a short circuit occurred on a control terminal of any one of the electronic switches of a respective switch module does not degrade the control signal magnitude on the control terminal of any other electronic switch of the respective switch module to be below a minimum value that is needed to turn on the electronic switch.

9. The apparatus of claim 4, wherein the protection elements of each protection module are independent driver stages that generate separate control signals for continuously turning on the respective electronic switches of a corresponding switch module, the independent driver stages of each protection module are designed such that a short circuit occurred on a control terminal of any one of the electronic switches of the respective switch module does not degrade the control signal magnitude on the control terminal of any other electronic switch of the corresponding switch module to be below a minimum value that is needed to turn on the electronic switch.

10. The apparatus of claim 1, wherein each of the series connected switch modules comprises three parallel connected flat-pack IGBTs or MOSFETs.

11. A method for controlling a plurality of series connected switch modules each comprising at least two parallel connected electronic switches, the method comprising:
   detecting a switch failure via a detection module which is (i) coupled with the plurality of series connected switch modules and (ii) configured to detect whether any electronic switch of the respective series connected switch modules has a failure;
   in response to a detection of a failure of any electronic switch of one or more switch modules:
      turning on any non-faulty electronic switch of one or more faulty switch modules when the electronic switches of other non-faulty switch modules are controlled to be turned on; and
      turning off the electronic switches of the non-faulty switch modules if the total number of the fault signals is greater than the total number of redundant switch modules.

12. The method of claim 11, further comprising:
in response to failure of any electronic switch of one or more switch modules, continuously turning on any non-faulty electronic switch of one or more faulty switch modules.

13. The method of claim 11, further comprising generating one or more fault signals for identifying one or more faulty switch modules if any electronic switch of one or more switch modules has failure.

14. The method of claim 13, further comprising:
using a controller to generate one or more alternative control signals for continuously turning on any non-faulty electronic switch of one or more faulty switch modules according to one or more fault signals;
using each of the protection modules to maintain a voltage magnitude of the respective alternative control signal at a desired voltage magnitude, such that one or more alternative control signals are sufficient to turn on any non-faulty electronic switch of one or more faulty switch modules;
wherein the protection modules are coupled between the controller and the electronic switches of the respective series connected switch modules.

15. The method of claim 14, wherein each protection module comprises protection elements coupled between the controller and the respective electronic switches of the corresponding switch module, the method further comprising:
using the protection elements of each protection module to limit currents flowed from the controller to the respective faulty electronic switches of the corresponding switch module.

16. A system for controlling a plurality of series connected switch modules each comprising at least two parallel connected electronic switches, the system comprising:
a detection module configured to detect whether any electronic switch of the respective series connected switch modules has a failure, and generate one or more fault signals for identifying one or more faulty switch modules which have a failure; and
a controller configured to, in response to failure of any electronic switch of one or more switch modules:
turn on any non-faulty electronic switch of one or more faulty switch modules when the electronic switches of other non-faulty switch modules are controlled to be turned on; and
turn off the electronic switches of the non-faulty switch modules if the total number of the fault signals is greater than the total number of redundant switch modules.

17. The system of claim 16, wherein the controller is further configured to, in response to failure of any electronic switch of one or more switch modules, continuously turn on any non-faulty electronic switch of the faulty switch modules.

* * * * *